(12) United States Patent
Wang et al.

(10) Patent No.: US 7,898,444 B2
(45) Date of Patent: Mar. 1, 2011

(54) DECODING METHOD

(75) Inventors: Wen-Shan Wang, Taipei (TW); Po-Wen Cheng, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 8 days.

(21) Appl. No.: 12/575,799

(22) Filed: Oct. 8, 2009

(65) Prior Publication Data

US 2010/0315269 A1   Dec. 16, 2010

(30) Foreign Application Priority Data

Jun. 12, 2009 (TW) .............................. 98119811 A

(51) Int. Cl.
*H03M 7/40* (2006.01)
(52) U.S. Cl. ..................... 341/65; 341/67; 341/106; 375/245; 375/253; 382/132; 382/166
(58) Field of Classification Search ............ 341/65, 341/67, 106; 375/245, 253; 382/132, 166
See application file for complete search history.

(56) References Cited

U.S. PATENT DOCUMENTS

| | | | |
|---|---|---|---|
| 5,254,991 A | 10/1993 | Ruetz et al. | |
| 5,467,131 A | 11/1995 | Bhaskaran et al. | |
| 5,654,806 A | 8/1997 | Truong | |
| 5,784,631 A | 7/1998 | Wise | |
| 5,818,364 A | 10/1998 | Hintzman et al. | |
| 5,825,312 A | 10/1998 | D'Ortenzio | |
| 6,121,905 A | 9/2000 | Redford | |
| 6,130,631 A | 10/2000 | Redford | |
| 6,292,114 B1* | 9/2001 | Tsai et al. | 341/67 |
| 6,373,412 B1* | 4/2002 | Mitchell et al. | 341/65 |
| 6,650,996 B1* | 11/2003 | Beesley et al. | 701/200 |
| 6,782,318 B1* | 8/2004 | Beesley et al. | 701/200 |
| 6,798,365 B2 | 9/2004 | Kim et al. | |
| 6,839,624 B1* | 1/2005 | Beesley et al. | 701/200 |
| 6,956,511 B2 | 10/2005 | Thomas et al. | |
| 7,283,591 B2* | 10/2007 | Ruehle | 375/253 |
| 7,340,103 B2* | 3/2008 | Smirnov | 382/245 |
| 7,564,379 B2* | 7/2009 | Ruehle | 341/67 |
| 7,724,827 B2* | 5/2010 | Liang et al. | 375/240.23 |
| 2010/0195739 A1* | 8/2010 | Lu et al. | 375/240.25 |

OTHER PUBLICATIONS

Compressed Data Formats specification; ISO/IEC 10918-1:1 1993.

* cited by examiner

*Primary Examiner*—Linh V Nguyen
(74) *Attorney, Agent, or Firm*—Thomas Kayden

(57) ABSTRACT

A decoding method comprising the following steps is provided. The $m^{th}$ lookup index for a new lookup table is obtained according to the number of leading 1's in the bit stream. The $n^{th}$ base Huffman code in a simplified Huffman table is obtained according to the $m^{th}$ lookup index. The (n+1) most significant bits (MSB) are obtained from the bit stream according to the $n^{th}$ base Huffman code. A difference is generated according to the (n+1) MSBs in the bit stream and the $n^{th}$ base Huffman code. Whether the difference is less than 0 is checked. If yes, a symbol index is generated according to the difference and the $n^{th}$ base symbol index, and a symbol is obtained according to the symbol index. If no, n is decreased or increased by 1 according to the method being used, and the data in the simplified Huffman table is compared continually.

22 Claims, 11 Drawing Sheets

10

| Symbol | Hofman Code |
|---|---|
| 0 | 00 |
| 1 | 010 |
| 2 | 011 |
| 3 | 100 |
| 4 | 101 |
| 5 | 110 |
| 6 | 1110 |
| 7 | 1111 0 |
| 8 | 1111 10 |
| 9 | 1111 110 |
| 10 | 1111 1110 |
| 11 | 1111 1111 0 |

| Hofman Code Index(n') | Symbol | Bit Length | Hofman Code |
|---|---|---|---|
| 0 | 0 | 2 | 00 |
| 1 | 1 | 3 | 010 |
| 2 | 2 | 3 | 011 |
| 3 | 3 | 3 | 100 |
| 4 | 4 | 3 | 101 |
| 5 | 5 | 3 | 110 |
| 6 | 6 | 4 | 1110 |
| 7 | 7 | 5 | 1111 0 |
| 8 | 8 | 6 | 1111 10 |
| 9 | 9 | 7 | 1111 110 |
| 10 | 10 | 8 | 1111 1110 |
| 11 | 11 | 9 | 1111 1111 0 |

| Lookup Index(m') | Huffman Code Index (Lookup[m']) |
|---|---|
| 0 | 0 |
| 1 | 3 |
| 2 | 5 |
| 3 | 6 |
| 4 | 7 |
| 5 | 8 |
| 6 | 9 |
| 7 | 10 |
| 8 | 11 |

| Index | | Content | | Index | | Content | |
|---|---|---|---|---|---|---|---|
| Node | Bit | NodeSE | Flag | Node | Bit | NodeSE | Flag |
| 0 | 0 | 1 | 0 | 6 | 0 | 6 | 1 |
| 0 | 1 | 2 | 0 | 6 | 1 | 7 | 0 |
| 1 | 0 | 0 | 1 | 7 | 0 | 7 | 1 |
| 1 | 1 | 3 | 0 | 7 | 1 | 8 | 0 |
| 2 | 0 | 4 | 0 | 8 | 0 | 8 | 1 |
| 2 | 1 | 5 | 0 | 8 | 1 | 9 | 0 |
| 3 | 0 | 1 | 1 | 9 | 0 | 9 | 1 |
| 3 | 1 | 2 | 1 | 9 | 1 | 10 | 0 |
| 4 | 0 | 3 | 1 | 10 | 0 | 10 | 1 |
| 4 | 1 | 4 | 1 | 10 | 1 | 11 | 0 |
| 5 | 0 | 5 | 1 | 11 | 0 | 11 | 1 |
| 5 | 1 | 6 | 0 | 11 | 1 | N/A | 0 |

| Base Huffman Code Index(n) | Base Symbol Index HfmBase[n].1stOfs | Base Huffman Code HfmBase[n].1stCode |
|---|---|---|
| 0 | 0 | 0 |
| 1 | 0 | 00 |
| 2 | 1 | 010 |
| 3 | 6 | 1110 |
| 4 | 7 | 1111 0 |
| 5 | 8 | 1111 10 |
| 6 | 9 | 1111 110 |
| 7 | 10 | 1111 1110 |
| 8 | 11 | 1111 1111 0 |
| 9 | 12 | 1111 1111 10 |
| 10 | 12 | 1111 1111 100 |
| 11 | 12 | 1111 1111 1000 |
| 12 | 12 | 1111 1111 1000 0 |
| 13 | 12 | 1111 1111 1000 00 |
| 14 | 12 | 1111 1111 1000 000 |
| 15 | 12 | 1111 1111 1000 0000 |

FIG. 5

| Lookup Index(m) | Huffman Code Index Lookup[m] |
|---|---|
| 0 | 2 |
| 1 | 2 |
| 2 | 2 |
| 3 | 3 |
| 4 | 4 |
| 5 | 5 |
| 6 | 6 |
| 7 | 7 |
| 8 | 8 |
| 9 | 15 |
| 10 | 15 |
| 11 | 15 |
| 12 | 15 |
| 13 | 15 |
| 14 | 15 |
| 15 | 15 |
| 16 | 15 |

| Base Huffman Code Index(n) | Base Symbol Index HfmBase[n].1stOfs | Base Huffman Code HfmBase[n].1stCode |
|---|---|---|
| 0 | 0 | 0 |
| 1 | 0 | 00 |
| 2 | 5 | 110 |
| 3 | 6 | 1110 |
| 4 | 7 | 1111 0 |
| 5 | 8 | 1111 10 |
| 6 | 9 | 1111 110 |
| 7 | 10 | 1111 1110 |
| 8 | 11 | 1111 1111 0 |
| 9 | 12 | 1111 1111 10 |
| 10 | 12 | 1111 1111 100 |
| 11 | 12 | 1111 1111 1000 |
| 12 | 12 | 1111 1111 1000 0 |
| 13 | 12 | 1111 1111 1000 00 |
| 14 | 12 | 1111 1111 1000 000 |
| 15 | 12 | 1111 1111 1000 0000 |

| Lookup Index(m) | Huffman Code Index Lookup[m] |
|---|---|
| 0 | 1 |
| 1 | 2 |
| 2 | 2 |
| 3 | 3 |
| 4 | 4 |
| 5 | 5 |
| 6 | 6 |
| 7 | 7 |
| 8 | 8 |
| 9 | 15 |
| 10 | 15 |
| 11 | 15 |
| 12 | 15 |
| 13 | 15 |
| 14 | 15 |
| 15 | 15 |
| 16 | 15 |

FIG. 11

| Unit: byte | Leading 1's search | One-bit Binary Search | The Present Embodiment Of The Invention |
|---|---|---|---|
| Hofman Table | 162x3 | 162x3 | 16x3 |
| Lookup Table | 17x1 | (162x2~162x3)x2 | 17x1 |
| Total | 503 | 1134~1458 | 65 |

FIG. 13

| | | Leading 1's search | One-bit Binary Search | The Present Embodiment Of The Invention |
|---|---|---|---|---|
| AC luminance | Best Scenario | 1 | 2 | 1 |
| | Worst Scenario | 64 | 16 | 3 |
| AC chrominance | Best Scenario | 1 | 2 | 1 |
| | Worst Scenario | 64 | 16 | 2 |

FIG. 14

DECODING METHOD

This application claims the benefit of Taiwan application Ser. No. 98119811, filed Jun. 12, 2009, the subject matter of which is incorporated herein by reference.

TECHNICAL FIELD

The invention relates in general to a decoding method.

BACKGROUND

Referring to both FIG. 1 and FIG. 2. FIG. 1 shows a Huffman table 10 at an encoding end. FIG. 2 shows a complete reconstructed Huffman table 20 at a decoding end. To assure data consistency, the encoding end and the decoding end must use the same Huffman table, so that the encoding end generates a symbol array Sym[ ] and a number-of-Huffman-code array NC[ ] according to the Huffman table 10. The symbol array Sym[ ] comprises all symbols in the Huffman table 10, wherein the symbols are arranged in an ascending order according to the code values of the corresponding Huffman code of the symbols. For example, the code values of the Huffman codes in the Huffman table 10 are arranged in an ascending order as 0, 2, 3, 4, 5, 6, 14, 30, 62, 126, 254, 510 (that is, the binary digits: 00, 010, 011, 100, 101, 110, 1110, 11110, 111110, 1111110, 11111110, 111111110), so the symbols in the symbol array are also arranged according to the sequence of the code values of the Huffman codes, and the corresponding symbol array is Sym[ ]={0, 1, 2, 3, 4, 5, 6, 7, 8, 9, 10, 11}. The number-of-Huffman-code array NC[ ] records the number of Huffman codes corresponding to each code length. The corresponding number-of-Huffman-code array of the Huffman table 10 is expressed as: NC[ ]={0, 1, 5, 1, 1, 1, 1, 1, 1, 0, 0, 0, 0, 0, 0, 0}. It is indicated in the Huffman table 10 there is no 1-bit Huffman code, one 2-bit Huffman code, five 3-bit Huffman codes, one Huffman code for each of the 4~9-bit Huffman codes, and zero Huffman code for each of the 10~16-bit Huffman codes. The encoding end stores the symbol array Sym[ ] and the number-of-Huffman-code array NC[ ] in a file header, and the decoding end reconstructs the Huffman table 20 according to the symbol array Sym[ ] and the number-of-Huffman-code array NC[ ] in the file header and generates a look-up table according to the Huffman table 20.

It is noted that the Huffman code indexes of FIG. 2 are exactly identical to the symbol values, which are arranged in a continual order. However, this is only an exceptional case, which does not occur to all Huffman tables.

Referring to both FIG. 2 and FIG. 3. FIG. 3 shows a conventional look-up table for leading 1's search algorithm. The lookup index m' for the look-up table 30 is equal to the number of leading 1's of the Huffman code in the Huffman table 20, and the Huffman code index Lookup[m'] for the look-up table 30 is the Huffman code index n' for the Huffman table 20, wherein n'=Lookup[m']. Thus, the corresponding lookup index m' for the look-up table 30 can be obtained according to the number of leading 1's in the to-be-decoded bit stream. After that, the Huffman code index n' for the Huffman table 20 can be obtained according to the corresponding Huffman code index Lookup[m'] for the lookup index m'. Lastly, the corresponding symbol is obtained by searching the Huffman codes and bit lengths in the Huffman table 20 according to Huffman code index n'.

To make the conventional leading 1's search decoding method easier to understand, let the bit stream be exemplified by 0111011 below. Firstly, the number of leading 1's in the bit stream 0111011 is equal to 0. That is, the lookup index m' for the look-up table 30 is equal to 0. Next, as the lookup index m' is equal to 0, the Huffman code index Lookup[m'] for the look-up table 30 equals Lookup[0]=0. Then, as the Huffman code index Lookup[0] for the look-up table 30 is equal to 0, the Huffman code index n' for the Huffman table 20 is equal to 0, and the Huffman table 20 is searched from the Huffman code index n' being equal to 0.

The corresponding Huffman code of the Huffman code index n' being equal to 0 is 00 and the bit length is 2, so the first 2 most significant bits (MSB) of the bit stream 0111011, which are 01, are compared with the Huffman code 00. As the bits 01 do not match with 00, the method continues to search the Huffman table 20 downward.

The next Huffman code index n' is equal to 1. As the corresponding Huffman code of the Huffman code index n' being equal to 1 is 010 and the bit length is 3, the first 3 most significant bits of the bit stream 0111011, which are 011, are compared with the Huffman code 010. As the bits 011 do not match with 010, the method continues to search the Huffman table 20 downward.

The next Huffman code index n' is equal to 2. As the corresponding Huffman code of the Huffman code index n' being equal to 2 is 011 and the bit length is 3, the first 3 most significant bits of the bit stream 0111011, which are 011, are compared with the Huffman code 011. As the bits 011 match with 011, the method stops searching the Huffman table 20. When the Huffman code index n' is equal to 2, Sym[n']=Sym[2]=2, the decoded symbol is 2 and the bit length is 3. Lastly, the 3 most significant bits are removed from the bit stream 0111011 to generate the new bit stream 1011.

To make the conventional leading 1's search decoding method easier to understand, let the bit stream be exemplified as 0010 below. Firstly, the number of leading 1's in the bit stream 0010 is equal to 0. That is, the lookup index m' for the look-up table 30 is equal to 0. Next, as the lookup index m' is equal to 0, the Huffman code index Lookup[m'] for the look-up table 30 equals Lookup[0]=0. Then, as the Huffman code index Lookup[0] for the look-up table 30 equals 0, the Huffman code index n' for the Huffman table 20 is equal to 0, and the Huffman table 20 is searched from the Huffman code index n' being equal to 0.

The corresponding Huffman code of the Huffman code index n' being equal to 0 is 00 and the bit length is 2, so the first 2 most significant bits of the bit stream 0010, which are 00, are compared with the Huffman code 00. As the bits 00 match with 00, the method stops searching the Huffman table 20. When the Huffman code index n' is equal to 0, Sym[n']=Sym[0]=0, the decoded symbol is 0 and the bit length is 2. Lastly, the 2 most significant bits are removed from the bit stream 0010 to obtain the new bit stream 10.

Thus, when the conventional leading 1's search method is used for searching the bit stream 0111011 and the bit stream 0010, at least 4 iterations of search are required to obtain the corresponding symbols 2 and 0.

Referring to FIG. 4, a look-up table for conventional one-bit binary search algorithm is shown. The look-up table 40 comprises a column Index and a column Content. The column Index comprises a node Node and a bit Bit, and the column Content comprises a value NodeSE and a flag Flag. Different nodes and bits respectively correspond to different values NodeSE and flags Flag. The node at the beginning of search must be 0 and the Bit is input one by one from the bit stream.

When the flag Flag equals 1, this implies that the binary search already finishes, and the value NodeSE is the corresponding symbol of the bit stream. To the contrary, when the flag Flag equals 0, this implies that the binary search has not yet finished, and the value NodeSE denotes the next node Node. Another binary search is performed according to the next node Node and the next bit Bit.

The symbol corresponding to the received bit stream can be located by searching the look-up table 40. To make the conventional one-bit binary search decoding method easier to understand, let the bit stream be exemplified as 0111011 below.

Firstly, the node Node is equal to "0", and the first bit in the bit stream is equal to "0", and the flag Flag and the value NodeSE which correspond to the node Node "0" and the bit Bit "0" are located by performing a first binary search and the flag Flag is "0", and the value NodeSE is "1". When the flag Flag equals "0", this implies that the search has not yet finished, and when the value NodeSE equals "1", this implies that the next node Node is "1".

Next, the node Node is "1", and the second bit in the bit stream is "1", and the flag Flag and the value NodeSE which correspond to the node Node "1" and the bit Bit "1" are located by performing a second binary search and the flag Flag is "0", and the value NodeSE is "3". When the flag Flag equals "0", this implies that the search has not yet finished; and when the value NodeSE equals "3", this implies that the next node Node is "3".

Then, the node Node is equal to "3", the third bit in the bit stream is equal to "1", and the flag Flag and the value NodeSE which correspond to the node Node "3" and the bit Bit "1" are located by performing a third binary search and the flag Flag is "1", and the value NodeSE is "2". When the flag Flag equals "1", this implies that the search has finished; and when the value NodeSE equals "2", this implies that the decoded symbol is "2".

To make the conventional one-bit binary search decoding method easier to understand, the bit stream 0010 is exemplified below.

Firstly, the node Node is equal to "0", and the first bit in the bit stream is equal to "0", and the flag Flag and the value NodeSE which correspond to the node Node "0" and the bit Bit "0" are located by performing a first binary search and the flag Flag is "0", and the value NodeSE is "1". When the flag Flag equals "0", this implies that the search has not yet finished; and when the value NodeSE equals "1", this implies that the next node Node is "1".

Next, the node Node is equal to "1", the second bit in the bit stream is equal to "0", and the flag Flag and the value NodeSE which correspond to the node Node "1" and the bit Bit "0" are located by performing a second binary search and the flag Flag is "1", and the value NodeSE is "0". When the flag Flag equals "1", this implies that the search has finished; and when the value NodeSE equals "0", this implies that the decoded symbol equals "0".

Thus, when the bit stream 0111011 and the bit stream 0010 are searched by the conventional one-bit binary search method, at least 5 iterations of search are required for obtaining the corresponding symbol 2 and symbol 0.

SUMMARY

The disclosure is directed to a decoding method. The decoding method comprises the following steps. The lookup index m for a new lookup table is obtained according to the number of leading 1's in the bit stream. The lookup index m is equal to the number of leading 1's in the bit stream. The base Huffman code index n of a simplified Huffman table is obtained according to the lookup index m, wherein the base Huffman code index n indexes the $n^{th}$ base Huffman code and the $n^{th}$ base symbol index in a simplified Huffman table and the base Huffman code index n is equal to the bit length of the $n^{th}$ base Huffman code decreased by 1. The (n+1) most significant bits (MSB) are obtained from the bit stream according to the base Huffman code index n. A difference is generated according to the (n+1) most significant bits in the bit stream and the $n^{th}$ base Huffman code. Whether the difference is less than 0 is checked. If the difference is not less than 0, then a symbol index is generated according to the difference and the $n^{th}$ base symbol index, and a symbol is obtained from symbol array, Sym[ ], according to the symbol index. If the difference is less than 0, then n is decreased or increased by 1 according to the method being used, and the data in the simplified Huffman table is compared continually.

The disclosure is focused on the JPEG Huffman table. However, the present embodiment can also cover other Huffman tables. For example, the longest JPEG Huffman code is 16 bits, therefore the largest number of leading 1's must be less than 17. In other applications, these numbers do not necessarily be 16 and 17.

The invention will become apparent from the following detailed description of the preferred but non-limiting embodiments. The following description is made with reference to the accompanying drawings.

BRIEF DESCRIPTION OF THE DRAWINGS

FIG. 1 shows a Huffman table at an encoding end;

FIG. 2 shows a complete reconstructed Huffman table at a decoding end;

FIG. 3 shows a conventional look-up table for leading 1's search;

FIG. 4 shows is a conventional look-up table for one-bit binary search;

FIG. 5 shows a simplified Huffman table of a first embodiment;

FIG. 7 shows a new lookup table for the simplified Huffman table of the first embodiment;

FIG. 10 shows is a simplified Huffman table of a second embodiment.

FIG. 11 shows a new lookup table for the simplified Huffman table of the second embodiment;

FIG. 13 shows a comparison of table size of JPEG Huffman table for AC luminance or AC chrominance according to conventional leading 1's search, conventional one-bit binary search and the present embodiment of the invention; and FIG. 14 shows a comparison of search iterations of JPEG Huffman table for AC luminance or AC chrominance according to conventional leading 1's search, conventional one-bit binary search and the present embodiment.

DETAILED DESCRIPTION

Figure 6:
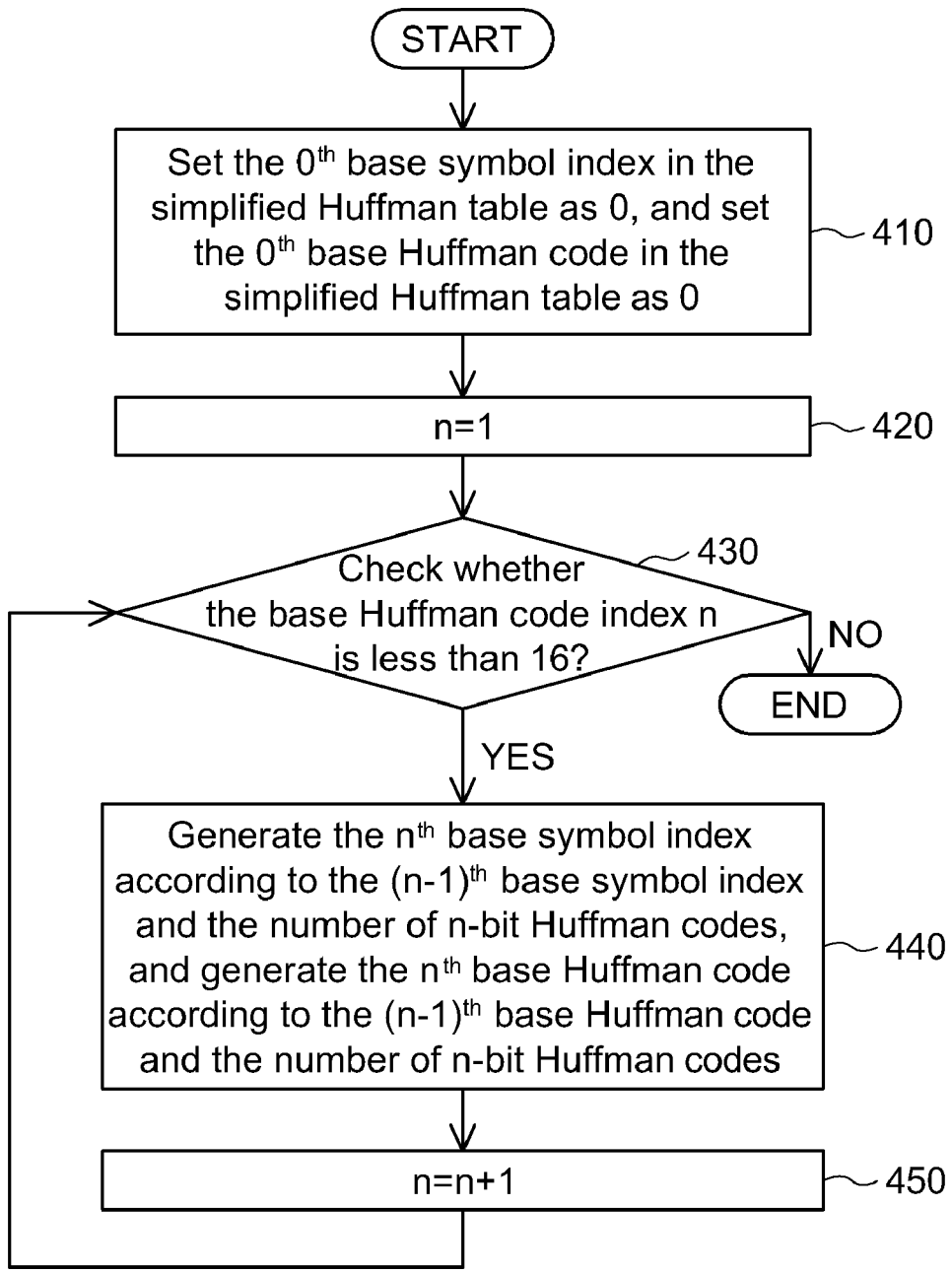
FIG. 6 shows a flowchart of the method for generating the simplified Huffman table of the first embodiment.

The method for reducing the table size of a complete Huffman table and a look-up table and increasing the decoding rate and the table reconstruction rate is exemplified in a first embodiment and a second embodiment below.

First Embodiment

Referring to both FIG. 2 and FIG. 5. FIG. 5 shows a simplified Huffman table of a first embodiment. The first embodiment provides a simplified Huffman table 50. To make the simplified Huffman table distinguished from a complete Huffman table 20, the simplified Huffman table is referred as the simplified Huffman table 50 here below. The simplified Huffman table 50 only records partial Huffman codes and the Huffman code indexes, which are equivalent to the symbol indexes, of the complete Huffman table 20. The partial Huffman codes recorded in the simplified Huffman table 50 are referred as the base Huffman codes HfmBase[n].1stCode here below, and the symbol indexes recorded in the simplified Huffman table 50 are referred as the base symbol indexes HfmBase[n].1stOfs here below.

The simplified Huffman table 50 comprises a base symbol index column and a base Huffman code column. Different base Huffman code index n in the base symbol index column correspond to different base symbol indexes HfmBase[n].1stOfs, and different base Huffman code index n in the base Huffman code column correspond to different base Huffman codes HfmBase[n].1stCode.

When the base Huffman code index n of the FIG. 5 is equal to 0, 9, 10, 11, 12, 13, 14, and 15, the corresponding base symbol index and the base Huffman code are all invalid. This is because when n is equal to 0, 9, 10, 11, 12, 13, 14, and 15, the values of NC[n] are all equal to 0 and this implies that these Huffman codes with length equal (n+1) do not exist. That means there is no Huffman code whose bit length is 1, 10, 11, 12, 13, 14, 15, or 16 bits.

Unlike the complete Huffman table which records all Huffman codes, the simplified Huffman table 50 only records the Huffman code with the smallest code value for those codes having the same bit length as the base Huffman code HfmBase[n].1stCode and records the base symbol index HfmBase[n].1stOfs corresponding to the base Huffman code HfmBase[n].1stCode. Besides, the base Huffman code index n is equal to the bit length of the corresponding base Huffman code HfmBase[n].1stCode minus 1. For example, in the complete Huffman table 20, the 3-bit Huffman codes comprise 010, 011, 100, 101, and 110 and their corresponding Huffman code index are 1, 2, 3, 4, and 5, respectively. The simplified Huffman table 50 does not record the five 3-bit Huffman codes, namely, 010, 011, 100, 101 and 110, and only the smallest code value 010 is recorded as the base Huffman code HfmBase[2].1stCode, and the Huffman code index 1 corresponding to the Huffman code 010 is recorded as the base symbol index HfmBase[2].1stOfs. The base Huffman code index n corresponding to the base Huffman code 010 is equal to the bit length of the base Huffman code 010 minus 1. Thus, the base Huffman code index n corresponding to the base Huffman code 010 is equal to 2.

The $n^{th}$ base Huffman code HfmBase[n].1stCode and the $n^{th}$ base symbol index HfmBase[n].1stOfs in the simplified Huffman table 50 are generated according to a symbol array Sym[ ] and a number-of-Huffman-code array NC[ ], which records the number of Huffman codes corresponding to each code length from 1 to 16 for JPEG standard. The $n^{th}$ base Huffman code HfmBase[n].1stCode is the Huffman code whose code value is the smallest one among those (n+1)-bit Huffman codes in the original Huffman table 20 For example, in FIG. 2, the 3-bit Huffman codes comprise 010, 011, 100, 101 and 110. The Huffman code 010 has the smallest code value among the Huffman codes 010, 011, 100, 101 and 110, therefore in FIG. 5, the second base Huffman code HfmBase[2].1stCode in the simplified Huffman table 50 equals 010.

Besides, the $n^{th}$ base symbol index HfmBase[n].1stOfs in the simplified Huffman table 50 corresponds to the $n^{th}$ base Huffman code HfmBase[n].1stCode. The $n^{th}$ base symbol index HfmBase[n].1stOfs is equal to the index for the symbol represented by the $n^{th}$ base Huffman code HfmBase[n].1stCode in the symbol array Sym[ ]. For example, in FIG. 2, the symbol corresponding to the Huffman code 010 is 1. As the index for the symbol 1 in the symbol array Sym[ ] is also 1, the second base symbol index HfmBase[2].1stOfs in the simplified Huffman table of FIG. 5 equals 1. To make the present embodiment easier to understand, a method for generating a simplified Huffman table 50 is exemplified below. However, the method is not for limiting the scope of protection of the disclosure.

Referring to FIG. 6, a flowchart of the method for generating the simplified Huffman table of the first embodiment is shown. Firstly, the method begins at step 410, the $0^{th}$ base symbol index HfmBase[0].1stOfs in the simplified Huffman table 50 is set as 0, and the $0^{th}$ base Huffman code HfmBase[0].1stCode in the simplified Huffman table 50 is set as 0. Next, the method proceeds to step 420, the base Huffman code index n is set as 1. Then, the method proceeds to step 430, whether the base Huffman code index n is less than 16 is checked. If the base Huffman code index n is not less than 16, then the method terminates. If the base Huffman code index n is less than 16, then the method proceeds to step 440. In step 440, the $n^{th}$ base symbol index HfmBase[n].1stOfs is generated according to the $(n-1)^{th}$ base symbol index HfmBase[n-1].1stOfs and the number of n-bit Huffman codes NC[n-1], and the $n^{th}$ base Huffman code HfmBase[n].1stCode is generated according to the $(n-1)^{th}$ base Huffman code HfmBase[n-1].1stCode and the number of n-bit Huffman codes NC[n-1]. Wherein, the $n^{th}$ base symbol index HfmBase[n].1stOfs=the HfmBase[n-1].1stOfs+NC[n-1], and the $n^{th}$ base Huffman code HfmBase[n].1stCode=(the $(n-1)^{th}$ base Huffman code HfmBase[n-1].1stCode+the number of n-bit Huffman codes NC[n-1])×2.

Afterwards, the method proceeds to step 450, the base Huffman code index n is progressively increased by 1. If the base Huffman code index n being progressively increased is still less than 16, then step 440 and step 450 are repeated. Wherein, the number of n-bit Huffman codes NC[n-1] is obtained from a number-of-Huffman-code array NC[ ].

There are many programming implementations of generating the simplified Huffman table 50, and an implementation is exemplified below for elaboration purpose only, but not for limiting the scope of protection of the invention. The simplified Huffman table 50 is implemented by the following program.

```
HfmBase[0].1stOfs=0;
HfmBase[0].1stCode=0;
for (n=1; n <16; n++) {
    // 1st offset of same length codes
    HfmBase[n].1stOfs=HfmBase[n-1].1stOfs+NC[n-1];
    // 1st code of same length codes
    HfmBase[n].1stCode=(HfmBase[n-1].1stCode+NC[n-1]) << 1;
}
```

Referring to both FIG. 5 and FIG. 7. The new lookup table 70, Lookup[m], is created according to the base Huffman code index n and the base Huffman code HfmBase[n].1stCode of the simplified Huffman table 50. It is noted that m of Lookup[m] is equal to the number of leading 1's of the Huffman code and the base Huffman code index Lookup[m] is the search entry of the base Huffman code index n in the simplified Huffman table 50. Thus, the equation, which is expressed as: Lookup[m]=n, implies that on the part of the base Huffman code in the simplified Huffman table 50, the number of leading 1's of the $n^{th}$ HfmBase[n].1stCode is equal to m. For example, when the index m for the new lookup table 70 is equal to 4, and the equation, which is expressed as: Lookup[m]=Lookup[4]=4=n, implies that the number of leading 1's of the fourth base Huffman code HfmBase[4].1stCode (=11110) in the simplified Huffman table 50 is equal to 4.

However, the above exemplification may have two exceptions. The first exception occurs when there are two or more base Huffman codes HfmBase[n].1stCode with the same number of leading 1's in the simplified Huffman table 50. These base Huffman codes HfmBase[n].1stCode with the same number of leading 1's respectively correspond to several base Huffman code indexes n. Meanwhile, the $m^{th}$ base Huffman code for the new lookup table 70 selects the largest of the base Huffman code index n. For example, in the simplified Huffman table 50, the number of leading 1's for both the 1st base Huffman code HfmBase[1].1stCode and the second base Huffman code HfmBase[2].1stCode is equal to 0. In the simplified Huffman table 50, the second base Huffman code index, 2, is larger than the first base Huffman code index, 1, therefore the $0^{th}$ base Huffman code index Lookup[0] for the new lookup table 70 equals 2.

The second exception occurs when the lookup index m for the new lookup table 70 cannot be obtained from the base Huffman code HfmBase[n].1stCode in the simplified Huffman table 50. Under such circumstances, the $m^{th}$ base Huffman code index Lookup[m] is equal to the $(m-1)^{th}$ base Huffman code index Lookup[m-1]. For example, the base Huffman code indexes Lookup[1] and Lookup[2] for the new lookup table 70 cannot be obtained from the simplified Huffman table 50. That is, none base Huffman code HfmBase[n].1stCode whose number of leading 1's equaling 1 or 2 is found in the simplified Huffman table 50. Meanwhile, for the new lookup table 70, the values of the base Huffman code indexes for m equals to 1 and 2 are expressed as: Lookup[2]=Lookup[1]=Lookup[0]=2.

Referring to FIG. 7, a new lookup table for the simplified Huffman table of the first embodiment is shown. To make the look-up table of the simplified Huffman table distinguished from the conventional look-up table, the look-up table of the simplified Huffman table is referred as the new lookup table 70 here below. The new lookup table 70 for the simplified Huffman table 50 comprises a base Huffman code index, Lookup[m], column, wherein the base Huffman code column is used for recording the corresponding base Huffman code index Lookup[m] of each lookup index m, the base Huffman code index Lookup[m] is the base Huffman code index n of the simplified Huffman table 50, and the lookup index m is equal to the number of leading 1's of the to-be-decoded bit stream. To make the present embodiment of the invention easier to understand, a method for generating a new lookup table 70 is exemplified below. However, the method is not for limiting the scope of protection of the disclosure.

It is noted that when the lookup index (m) of FIG. 7 is larger than 8, all the corresponding base Huffman codes of the lookup index (m) are invalid. This is because in FIG. 5, the largest valid base Huffman code index (n) is 8, the value of its corresponding NC[n] equals 1, and its corresponding HfmBase[n].1stCode is 1111 1111 0. That is, the largest code in the Huffman table is 1111 1111 0, so the largest number of leading 1's is 8, and the largest valid lookup index m is 8.

Figure 8:
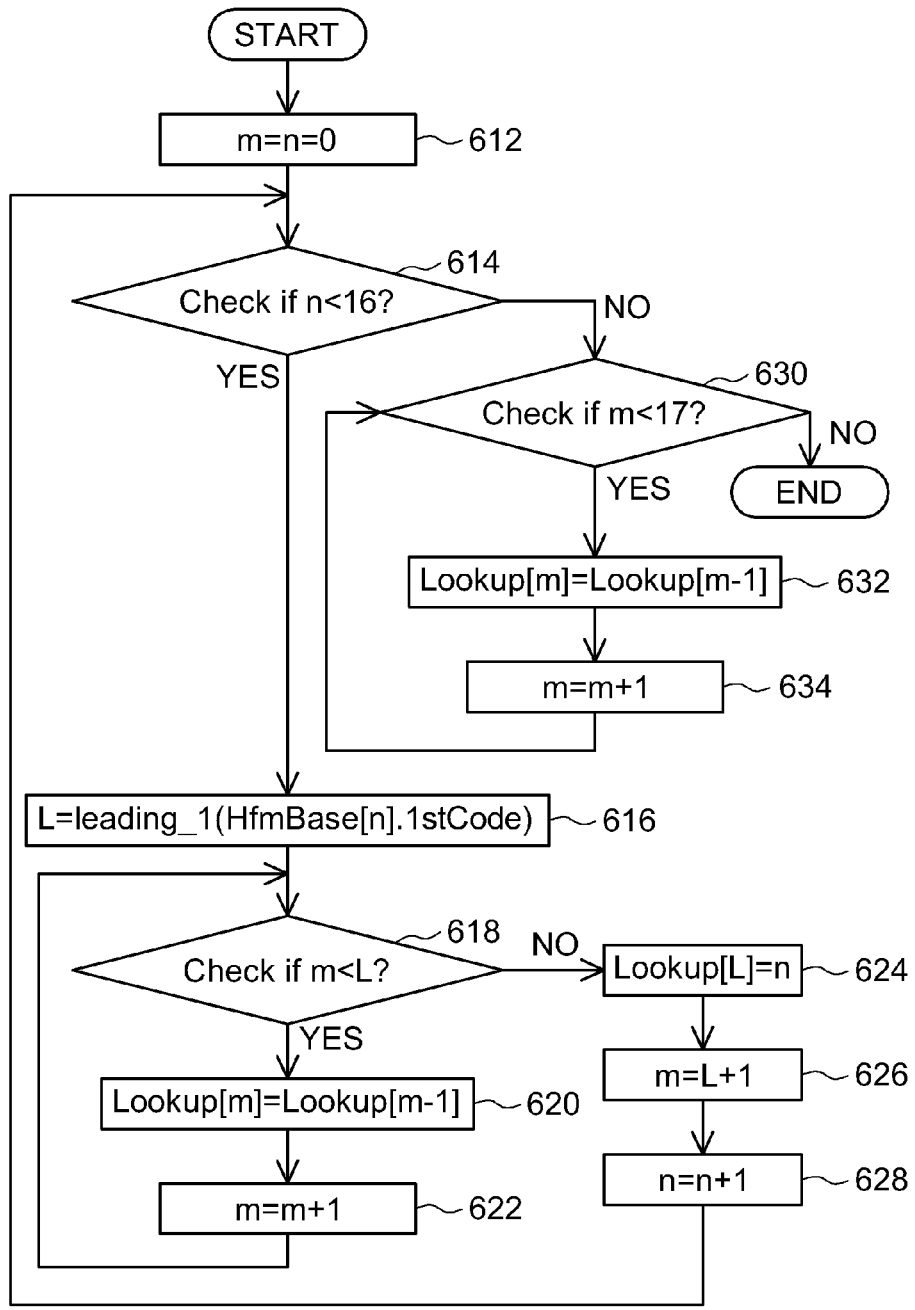
FIG. 8 shows a flowchart of the method for generating a new lookup table for the simplified Huffman table of the first embodiment.

Referring to FIG. 8, a flowchart of the method for generating a new lookup table for the simplified Huffman table of the first embodiment is shown. Firstly, the method begins at step 612, the lookup index m is set as the base Huffman code index n which is equal to 0. Next, the method proceeds to step 614, whether the base Huffman code index n is less than 16 is checked. If the base Huffman code index n is not less than 16, then step 630 is performed. To the contrary, if the base Huffman code index n is less than 16, then step 616 is performed. In step 616, the number of leading 1's of the $n^{th}$ base Huffman code HfmBase[n].1stCode is calculated and assigned to L.

As the simplified Huffman table 50 does not record all Huffman codes, partial base Huffman code index, i.e., Lookup[m], for the new lookup table 70 cannot be directly obtained from the simplified Huffman table 50. For example, in the complete Huffman table 20, the 3-bit Huffman codes comprise 010 and 011 whose lookup index m' equals 0, 100 and 101 whose lookup index m' equals 1, and 110 whose lookup index m' equals 2. Thus, the look-up table 30 directly obtains from the complete Huffman table 20 that the Huffman code index Lookup[m'] whose lookup index m' equals 0 is equal to 0, the Huffman code index Lookup[m'] whose lookup index m' equals 1 is equal to 3 and the Huffman code index Lookup[m'] whose lookup index m' equals 2 is equal to 5. However, the simplified Huffman table 50 only records 010 whose lookup index m equals 0. When the lookup index m is equal to 1 or 2, partial base Huffman codes Lookup[m] for the new lookup table 70 cannot be directly obtained from the simplified Huffman table 50, therefore steps 618, 620 and 622 are performed to pad for the partial base Huffman code indexes Lookup[m] that cannot be directly obtained from the simplified Huffman table 50, such as Lookup[1] and Lookup[2] for example.

In step 618, whether the lookup index m is less than the number of leading 1's of the $n^{th}$ base Huffman code HfmBase[n].1stCode L is checked. If the lookup index m is not less than the number of leading 1's L of the $n^{th}$ base Huffman code HfmBase[n].1stCode, it is implied that m is equal to L because m must not be larger than L. That is, no number of leading 1's is missing, and step 624 is performed. To the contrary, if the lookup index m is less than the number of leading 1's of the $n^{th}$ base Huffman code HfmBase[n].1stCode, i.e., L, it is implied that there is at least one missing number of leading 1's, and step 620 is performed. In step 620, the $m^{th}$ base Huffman code index Lookup[m] for the new lookup table 70 is padded by the $(m-1)^{th}$ base Huffman code index Lookup[m-1]. Next, the method proceeds to step 622, the lookup index m is progressively increased by 1. Then, steps 618, 620 and 622 are repeated until the lookup index m is not less than the number of leading 1's of the $n^{th}$ base Huffman code HfmBase[n].1stCode, i.e., L, and then the method proceeds to step 624.

In step 624, the $L^{th}$ base Huffman code index Lookup[L] for the new lookup table 70 is set as the base Huffman code index n. Next, the method proceeds to step 626, the lookup index m is equal to the number of leading 1's of the $n^{th}$ base Huffman code HfmBase[n].1stCode, i.e., L, increased by 1. The new m value represents what the next number of leading 1's is expected, that is, the next index for the new lookup table is supposed to be under construction. Then, the method proceeds to step 628, n is increased by 1, and then the method returns to step 614.

The three steps 630, 632 and 634 are used for padding the corresponding base Huffman code index Lookup[m] of the trailing lookup index m. Neither the complete Huffman table nor the simplified Huffman table can guarantee to provide the 17 values (0~16) of the number of leading 1's. In step 630, whether the lookup index m is less than 17 is checked. If the lookup index m is not less than 17, then the method terminates because the number of leading 1's m must not be equal to 17. To the contrary, if the lookup index m is less than 17, then step 632 is performed. In step 632, the $m^{th}$ base Huffman code index Lookup[m] for the new lookup table 70 is set as the $(m-1)^{th}$ base Huffman code index Lookup[m−1], and this is a padding step like step 620. Next, the method proceeds to step 634, the lookup index m is progressively increased by 1, and then the method returns to step 630.

There are many programming implementations of generating the new lookup table 70, and an implementation is exemplified below for elaboration purpose only, but not for limiting the scope of protection of the invention. The new lookup table 70 is implemented by the following program.

```
for (m=n=0; n < 16; n++) { // for all code lengths....
    // get number of leading 1's in simplified table
    L=leading_one (HfmBase[n].1stCode);
    for (; m < L; m++)         // pad the gap in Lookup[ ] if there is
        Lookup[m]=Lookup[m - 1];
    Lookup[L]=n;               // save (length - 1) to Lookup[ ]. Overwrite is
    possible.
    m=L+1;
}
    for (; m < 17; m++)        // pad the trailing elements in Lookup[ ]
        Lookup[m]=Lookup[m - 1];
```

The function leading_one( ) in the above program is for calculating the number of leading 1's in the bit stream or Huffman code.

Figure 9:
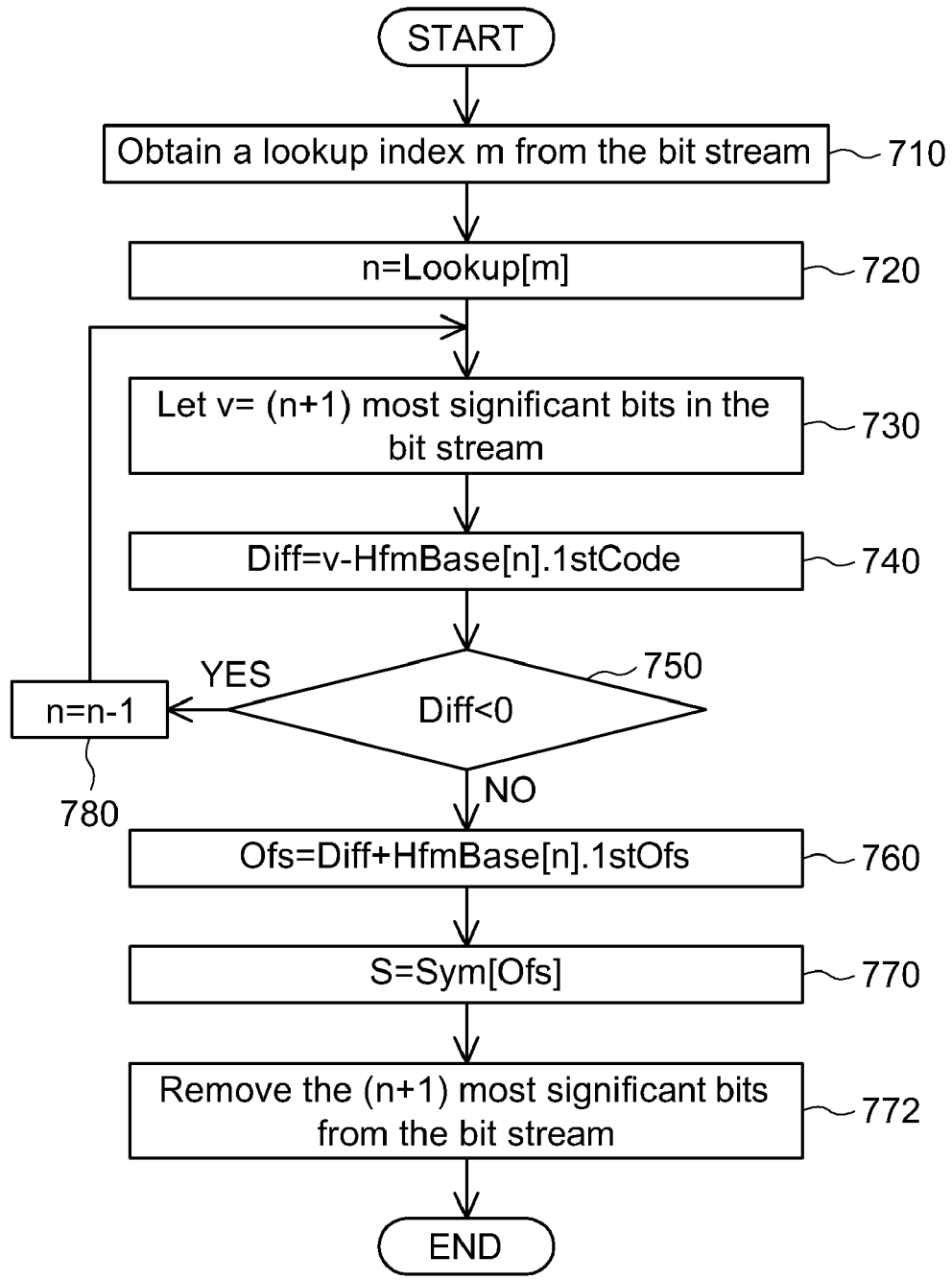
FIG. 9 shows a flowchart of a decoding method according to the first embodiment.

Referring to FIG. 9, a flowchart of a decoding method according to the first embodiment is shown. Firstly, the method begins at step 710, a lookup index m for a new lookup table 70 is obtained according to the number of leading 1's in the to-be-decoded bit stream for indicating the number of leading 1's in the bit stream. As the lookup index m is used for indicating the number of leading 1's in the bit stream, when the lookup index m is equal to 1, this implies that the number of leading 1's in the bit stream is equal to 1, when the lookup index m is equal to 2, this implies that the number of leading 1's in the bit stream is equal to 2, and other numbers of leading 1's in the bit stream can be obtained in the same manner. That is, the lookup index m is equal to the number of leading 1's in the bit stream.

Next, the method proceeds to step 720, the base Huffman code index n in the simplified Huffman table 50 is obtained according to the lookup index m, wherein the base Huffman code index n indexes the $n^{th}$ base Huffman code HfmBase[n].1stCode in the simplified Huffman table 50 and the $n^{th}$ base symbol index HfmBase[n].1stOfs, the base Huffman code index n is equal to the bit length of the $n^{th}$ base Huffman code HfmBase[n].1stCode minus 1, and the base Huffman code index n is obtained from the base Huffman code index Lookup[m].

Then, the method proceeds to step 730, (n+1) most significant bits are obtained from the bit stream according to the base Huffman code index n. wherein, the (n+1) most significant bits in the bit stream are designated by v in the first embodiment. As the base Huffman code index n is equal to the bit length of the $n^{th}$ base Huffman code HfmBase[n].1stCode minus 1, the bit length of the $n^{th}$ base Huffman code HfmBase[n].1stCode is obtained according to the base Huffman code index n in step 730 first, and then the (n+1) most significant bits in the bit stream are obtained according to the bit length of the $n^{th}$ base Huffman code HfmBase[n].1stCode next.

Afterwards, the method proceeds to step 740, the difference Diff is generated according to the (n+1) most significant bits of bit stream, i.e. v, and the $n^{th}$ base Huffman code HfmBase[n].1stCode, wherein, the difference Diff is equal to the (n+1) most significant bits of bit stream, i.e., v, minus the $n^{th}$ base Huffman code HfmBase[n].1stCode.

After that, the method proceeds to step 750, whether the difference Diff is less than 0 is checked. If the difference Diff is not less than 0, then the method proceeds to step 760, a symbol index Ofs is generated according to the difference Diff and the $n^{th}$ base symbol index HfmBase[n].1stOfs, wherein the symbol index Ofs is equal to the difference Diff plus the $n^{th}$ base symbol index HfmBase[n].1stOfs.

Next, the method proceeds to step 770, a symbol, that is, S, is obtained according to the symbol index Ofs. In step 770, a corresponding symbol is obtained from a symbol array Sym[ ] in the file header according to the symbol index Ofs, that is, S=Sym[Ofs].

Then, the method proceeds to step 772, the (n+1) most significant bits are removed from the bit stream to generate a new bit stream.

To the contrary, if the difference Diff is less than 0, then the method proceeds to step 780, the base Huffman code index n is progressively decreased, and then the method returns to step 730.

To make the decoding method of the first embodiment easier to understand, the bit stream 0111011 is exemplified below. Firstly, the method proceeds to step 710, the number of leading 1's in the bit stream 0111011 is equal to 0, the lookup index m for the new lookup table 70 is obtained according to the number of leading 1's in the bit stream 0111011, wherein the lookup index m is equal to 0. Next, the method proceeds to step 720, the base Huffman code index n in the simplified Huffman table 50 is equal to the base Huffman code index Lookup[0] recorded in the new lookup table 70, wherein Lookup[0]=2.

Then, the method proceeds to step 730, the 3 most significant bits 011 are obtained from the bit stream according to the base Huffman code index n, which is equal to 2. Afterwards, the method proceeds to step 740, the second base Huffman code HfmBase[2].1stCode in the simplified Huffman table 50 and the second base symbol index HfmBase[2].1stOfs are obtained for the first time according to the base Huffman code index n. The second base Huffman code HfmBase[2].1stCode in the simplified Huffman table 50 is 010 and the second base symbol index HfmBase[2].1stOfs in the simplified Huffman table 50 is 1. The difference Diff, which is equal to the 3 most significant bits in the bit stream 011 minus the second base Huffman code 010, is equal to 1.

After that, the method proceeds to step 750, whether the difference Diff is less than 0 is checked. As the difference Diff is equal to 1 but not less than 0, the method proceeds to step 760, the symbol index Ofs is equal to the difference Diff plus the second base symbol index HfmBase[n].1stOfs, wherein, the difference Diff is equal to 1 and the second base symbol index HfmBase[n].1stOfs is equal to 1, so the symbol index Ofs is equal to 2.

Next, the method proceeds to step 770, a symbol S being equal to Sym[Ofs] is obtained from a symbol array Sym[ ] in the file header according to the symbol index Ofs. For example, the symbol array is {0, 1, 2, 3, 4, 5, 6, 7, 8, 9, 10, 11}, and when the symbol index Ofs is equal to 2, the obtained symbol is equal to Sym[2]=2.

Then, the method proceeds to step 772, the 3 most significant bits are removed from the bit stream 011 to obtain a new bit stream 1011.

To make the decoding method easier to understand, a bit stream 0010 is exemplified below. Firstly, the method begins at step 710, the number of leading 1's in the bit stream 0010 is equal to 0, and a lookup index m for the new lookup table 70 is obtained according to the number of leading 1's in the bit stream 0010, wherein the lookup index m equals 0.

Next, the method proceeds to step 720, the base Huffman code index n in the simplified Huffman table 50 is equal to the base Huffman code index Lookup[0] recorded in the new lookup table 70, wherein Lookup[0]=2. Then, the method proceeds to step 730, the 3 most significant bits in the bit stream s 001 are obtained from the bit stream according to the base Huffman code index n, which is equal to 2.

Afterwards, the method proceeds to step 740, the second base Huffman code HfmBase[2].1stCode in the simplified Huffman table 50 and the second base symbol index HfmBase[2].1stOfs are obtained for the first time according to the base Huffman code index n. The second base Huffman code HfmBase[2].1stCode in the simplified Huffman table 50 is 010, and the second base symbol index HfmBase[2].1stOfs in the simplified Huffman table 50 is 1. The difference Diff, which is equal to the 3 most significant bits in the bit streams 001 minus the second base Huffman code 010, is equal to −1.

After that, the method proceeds to step 750, whether the difference Diff is less than 0 is checked. As the difference Diff is equal to −1 and less than 0, the method proceeds to step 780, the base Huffman code index n is progressively decreased. The base Huffman code index n being progressively decreased changes to 1 from 2, and in step 730, 2 most significant bits 00 are obtained from the bit stream according to the base Huffman code index n, which is equal to 1.

Then, step 740 is repeated. The first base Huffman code HfmBase[1].1stCode in the simplified Huffman table 50 and the first base symbol index HfmBase[1].1stOfs are obtained for the second time according to the base Huffman code index n, which is equal to 1. The first base Huffman code HfmBase[1].1stCode in the simplified Huffman table 50 is 00, and the first base symbol index HfmBase[1].1stOfs in the simplified Huffman table 50 is 0. The difference Diff, which is equal to the 2 most significant bits 00 in the bit stream minus the first base Huffman code 00, is equal to 0.

Then, step 750 is repeated, whether the difference Diff is less than 0 is checked. As the difference Diff is equal to 0 but not less than 0, the method proceeds to step 760, a symbol index Ofs is generated by adding the difference Diff to the first base symbol index HfmBase[1].1stOfs. As the difference Diff, which is equal to 0 and the first base symbol index HfmBase[1].1stOfs, is equal to 0, the symbol index Ofs is equal to 0. Next, the method proceeds to step 770, a symbol S being equal to Sym[Ofs] is obtained from a symbol array Sym[ ] in the file header according to the symbol index Ofs. For example, the symbol array is {0, 1, 2, 3, 4, 5, 6, 7, 8, 9, 10, 11}, and when the symbol index Ofs is equal to 0, the obtained symbol is equal to Sym[0]=0.

Then, the method proceeds to step 772, the 2 most significant bits are removed from the bit stream 0010 to obtain a new bit stream 10.

According to the decoding method disclosed above, the corresponding symbol 2 and symbol 0 are promptly obtained from the bit streams 0111011 and 0010 through three iterations of comparison only.

Second Embodiment

Referring to both FIG. 2 and FIG. 10. The $n^{th}$ base Huffman code HfmBase[n].1stCode and the $n^{th}$ base symbol index HfmBase[n].1stOfs in the simplified Huffman table 100 are generated according to the symbol array Sym[ ], the number-of-Huffman-code array NC[ ] and the index n. The $n^{th}$ base Huffman code HfmBase[n].1stCode is the Huffman code whose code value is the largest one among those (n+1)-bit Huffman codes in the original Huffman table 20. For example, in FIG. 2, the 3-bit length Huffman codes comprise 010, 011, 100, 101, and 110. As the code value of the Huffman code 110 is the largest among the Huffman codes 010, 011, 100, 101 and 110, in FIG. 10, the second base Huffman code HfmBase[2].1stCode in the simplified Huffman table 100 equals 110.

Besides, the $n^{th}$ base symbol index HfmBase[n].1stOfs in the simplified Huffman table 100 corresponds to the $n^{th}$ base Huffman code HfmBase[n].1stCode. The $n^{th}$ base symbol index HfmBase[n].1stOfs is equal to the index for the symbol represented by the $n^{th}$ base Huffman code HfmBase[n].1stCode in the symbol array Sym[ ]. For example, in FIG. 2, the corresponding symbol of the Huffman code 110 is 5. As the index for the symbol 5 in the symbol array Sym[ ] is also 5, the second base symbol index HfmBase[2].1stOfs in the simplified Huffman table 100 equals 5.

Referring to FIG. 10, a simplified Huffman table of a second embodiment is shown. In the first embodiment, the Huffman code with the smallest code value selected from the Huffman codes with the same bit length and its corresponding Huffman code index are used as the base Huffman code HfmBase[n].1stCode and the base symbol index HfmBase[n].1stOfs. The simplified Huffman table of the second embodiment 100 differs with the simplified Huffman table of the first embodiment 50 in that in the second embodiment, the Huffman code with the largest code value selected from the Huffman codes with the same bit length and its corresponding Huffman code index are used as the base Huffman code HfmBase[n].1stCode and the base symbol index HfmBase[n].1stOfs.

For example, in the complete Huffman table 10, the 3-bit Huffman codes comprise 010, 011, 100, 101 and 110. The simplified Huffman table 100 does not record the Huffman code with the smallest code value 010 among 010, 011, 100, 101 and 110 but merely records the largest code value 110 as the base Huffman code HfmBase[2].1stCode, and records the corresponding Huffman code index 5 of the Huffman code 110 as the base symbol index HfmBase[2].1stOfs. The corresponding base Huffman code index n of the base Huffman code 110 is equal to the bit length of the base Huffman code 010 decreased by 1. Thus, the corresponding base Huffman code index n of the base Huffman code 110 is equal to 2.

When the base Huffman code index (n) of FIG. 10 is equal to 0, 9, 10, 11, 12, 13, 14, 15, the corresponding base symbol index and the base Huffman code are all invalid. This is because when n is equal to 0, 9, 10, 11, 12, 13, 14, 15, the values of NC[n] are all equal to 0, that is, these (n+1)-bit Huffman codes do not exist.

Referring to both FIG. 10 and FIG. 11. The base Huffman code index Lookup[m] for the new lookup table 110 is created according to the index n for the base Huffman code HfmBase[n].1stCode in the simplified Huffman table 100. Wherein, m is equal to the number of leading 1's of the $n^{th}$ Huffman code, and the base Huffman code index Lookup[m] is equal to the index n for the base Huffman codes HfmBase[n].1stCode with m leading 1's in the simplified Huffman table 100. Therefore, the equation, which is expressed as: Lookup[m]= n, implies that on the part of the base Huffman code in the simplified Huffman table 100, the number of leading 1's of the $n^{th}$ HfmBase[n].1stCode is equal to m. For example, when the index m for the new lookup table 110 is equal to 4, the equation, which is expressed as: Lookup[m]=Lookup[4]= 4=n, implies that the number of leading 1's of the $4^{th}$ base Huffman code HfmBase[4].1stCode (=11110) in the simplified Huffman table 100 is equal to 4.

However, the above exemplification may have two exceptions. The first exception occurs when there are more than two base Huffman codes HfmBase[n].1stCode with the same number of leading 1's in the simplified Huffman table 100. These base Huffman codes HfmBase[n].1stCode with the same number of leading 1's respectively correspond to several base Huffman code indexes n, so the $m^{th}$ base Huffman code for the new lookup table 110 is equal to the smallest among the base Huffman code indexes n. As the first exception does not occur to FIG. 10, FIG. 10 cannot be taken for example. However, assume the number of leading 1's of the first base Huffman code HfmBase[1].1stCode and the second base Huffman code HfmBase[2].1stCode in a specific simplified Huffman table be equal to 0. As the first base Huffman code index 1 in that specific simplified Huffman table is less than the second base Huffman code index 2, the $0^{th}$ base Huffman code index Lookup[0] in the corresponding new lookup table of that specific simplified Huffman table equals 1.

The second exception occurs when the lookup index m for the new lookup table 110 cannot be obtained from the base Huffman code HfmBase[n].1stCode in the simplified Huffman table 100. Under such circumstances, the $m^{th}$ base Huffman code index Lookup[m] is equal to the $(m+1)^{th}$ base Huffman code index Lookup[m+1]. For example, the base Huffman code index Lookup[1] for the new lookup table 110 cannot be obtained from the simplified Huffman table 100. That is, none base Huffman code HfmBase[n].1stCode whose number of leading 1's equals 1 is found in the simplified Huffman table 100. Meanwhile, for the new lookup table 110, the values of the base Huffman code indexes are expressed as: Lookup[1]=Lookup[2]=2.

Referring to FIG. 11, a new lookup table for the simplified Huffman table of the second embodiment is shown. As the simplified Huffman table of the second embodiment 100 differs with the simplified Huffman table of the first embodiment 50, the corresponding new lookup table 110 of the simplified Huffman table 100 also differs with the corresponding new lookup table 70 of the simplified Huffman table 50. When the lookup index m is equal to 0, the base Huffman code index recorded in the new lookup table 70 is equal to 2, and the base Huffman code index recorded in the new lookup table 110 is equal to 1.

When the lookup index (m) of FIG. 11 is larger than 8, the corresponding base Huffman codes of the lookup index (m) are all invalid. This is because the largest valid base Huffman code index (n) in FIG. 10 is 8, and the corresponding HfmBase[n].1stCode of the largest valid base Huffman code index (n) is 1111 1111 0. That is, the largest code in the Huffman table is 1111 1111 0, so the largest number of leading 1's is 8, that is, the largest lookup index m is 8.

The base value selected in the first embodiment is different from that selected in the second embodiment, so the contents of the simplified Huffman table and the new lookup table generated in the two embodiments as well as the generating methods are also different. Despite the generating methods are different, the spirit for generating these tables is the same. Thus, the method for generating the simplified Huffman table 100 and the new lookup table 110 of the second embodiment is not repeated here.

Figure 12:
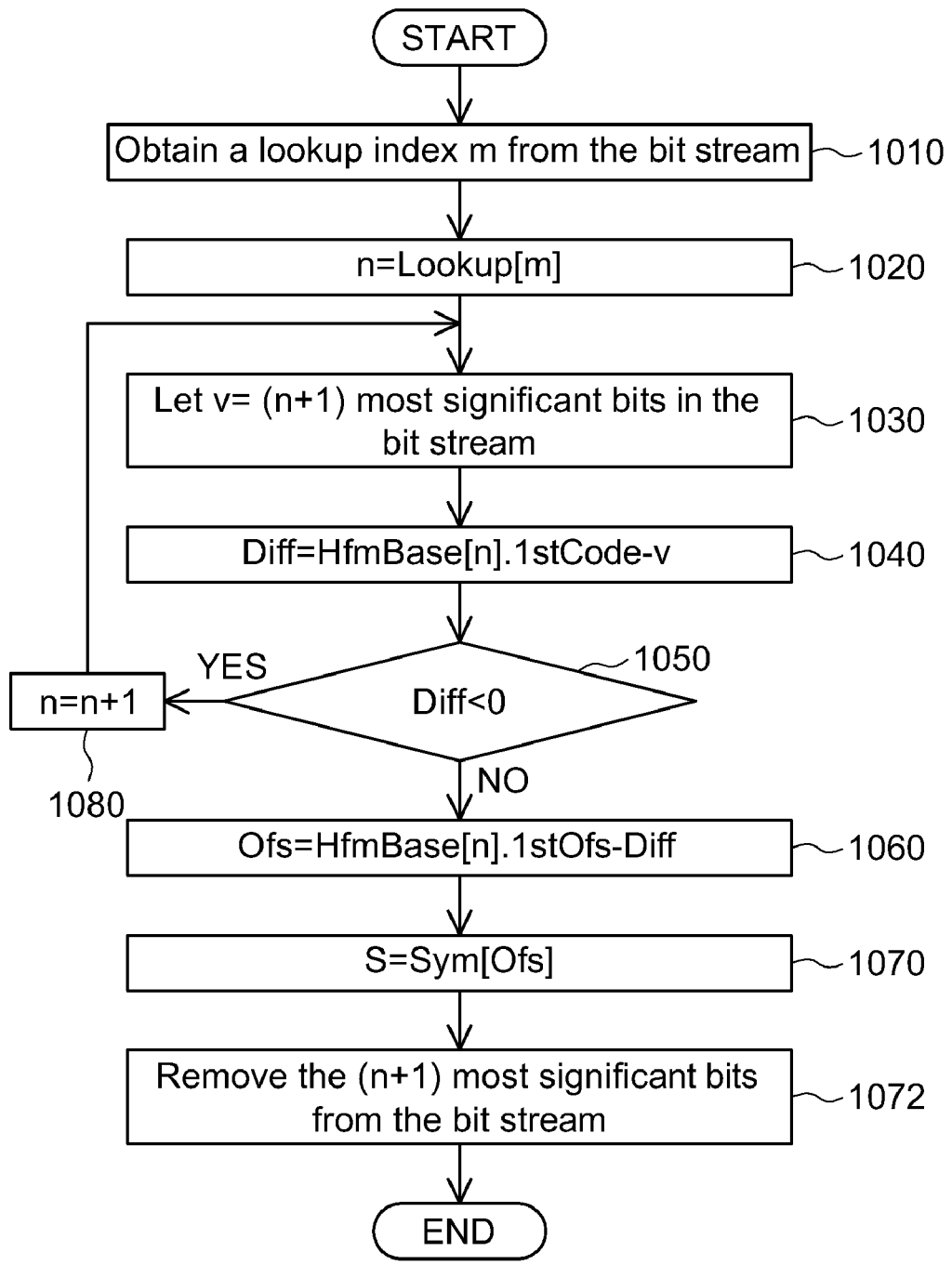
FIG. 12 shows a flowchart of a decoding method according to the second embodiment.

Referring to FIG. 12, a flowchart of a decoding method according to the second embodiment is shown. Firstly, the method proceeds to step 1010, a lookup index m for the new lookup table 110 is obtained according to the number of leading 1's in the to-be-decoded bit stream, wherein the lookup index m indicates the number of leading 1's in the bit stream. As the lookup index m is used for indicating the number of leading 1's in the bit stream, when the lookup index m is equal to 1, this implies that the number of leading 1's in the bit stream is equal to 1, when the lookup index m is equal to 2, this implies that the number of leading 1's in the bit stream is equal to 2, and other numbers of leading 1's in the bit stream can be obtained in the same manner. That is, the lookup index m is equal to the number of leading 1's in the bit stream.

Next, the method proceeds to step 1020, the base Huffman code index n in the simplified Huffman table 100 is obtained according to the lookup index m, wherein the base Huffman code index n indexes the $n^{th}$ base Huffman code HfmBase[n].1stCode in the simplified Huffman table 100 and the $n^{th}$ base symbol index HfmBase[n].1stOfs, and the base Huffman code index n is equal to the bit length of the $n^{th}$ base Huffman code HfmBase[n].1stCode minus 1. Wherein, the base Huffman code index n is equal to the base Huffman code index Lookup[m].

Then, the method proceeds to step 1030, (n+1) most significant bits are obtained from the bit stream according to the base Huffman code index n, wherein, the (n+1) most significant bits in the bit stream are designated by v in the second embodiment. As the base Huffman code index n is equal to the bit length of the $n^{th}$ base Huffman code HfmBase[n].1stCode minus 1, in step 1030, the bit length of the $n^{th}$ base Huffman code HfmBase[n].1stCode is obtained according to the base Huffman code index n first, and then the (n+1) most significant bits in the bit stream are obtained according to the bit length of the $n^{th}$ base Huffman code HfmBase[n].1stCode next.

Afterwards, the method proceeds to step 1040, a difference Diff is generated according to the (n+1) most significant bits of bit stream, i.e., v, and the $n^{th}$ base Huffman code HfmBase[n].1stCode, wherein, the difference Diff is equal to the $n^{th}$ base Huffman code HfmBase[n].1stCode minus the (n+1) most significant bits of bit stream, i.e., v.

After that, the method proceeds to step 1050, whether the difference Diff is less than 0 is checked. If the difference Diff is not less than 0, then the method proceeds to step 1060, a symbol index Ofs is equal to the $n^{th}$ base symbol index HfmBase[n].1stOfs minus the difference Diff. To the contrary, if the difference Diff is less than 0, then the method proceeds to step 1080, the base Huffman code index n is progressively increased, and the method returns to step 1030.

Next, the method proceeds to step 1070, a symbol, that is S, is obtained according to the symbol index Ofs. In, step 1070, a corresponding symbol is obtained from a symbol array Sym[ ] in the file header according to the symbol index Ofs, that is, S=Sym[Ofs].

Then, the method proceeds to step 1072, the (n+1) most significant bits are removed from the bit stream to generate a new bit stream.

To make the decoding method of the second embodiment easier to understand, the bit stream 0111011 is exemplified below. Firstly, the method proceeds to step 1010, the number of leading 1's in the bit stream 0111011 is equal to 0, and the lookup index m being equal to 0 for the new lookup table 110 is obtained according to the number of leading 1's in the bit stream 0111011.

Next, the method proceeds to step 1020, the base Huffman code index n in the simplified Huffman table 100 is equal to the base Huffman code index Lookup[0] recorded in the new lookup table 110, wherein Lookup[0]=1. Then, the method proceeds to step 1030, the 2 most significant bits 01 in the bit stream are obtained according to the base Huffman code index n which is equal to 1.

Afterwards, the method proceeds to step 1040, the first base Huffman code HfmBase[1].1stCode in the simplified Huffman table 100 and the first base symbol index HfmBase[1].1stOfs are obtained for the first time according to the base Huffman code index n. The first base Huffman code HfmBase[1].1stCode in the simplified Huffman table 100 is 00, and the first base symbol index HfmBase[1].1stOfs in the simplified Huffman table 100 is 0. The difference Diff, which is equal to the first base Huffman code 00 minus the 2 most significant bits 01 in the bit stream, is equal to −1.

After that, the method proceeds to step 1050, whether the difference Diff is less than 0 is checked. As the different Diff is equal to −1 and less than 0, the method proceeds to step 1080, the base Huffman code index n is progressively increased, and the progressively increased base Huffman code index n changes to 2 from 1, and step 1030 is repeated, 3 most significant bits in the bit stream 011 are obtained according to the base Huffman code index n which is equal to 2.

Then, step 1040 is repeated, the second base Huffman code HfmBase[2].1stCode in the second search the simplified Huffman table 100 and the second base symbol index HfmBase[2].1stOfs are obtained for the second time according to the base Huffman code index n being equal to 2. The second base Huffman code HfmBase[2].1stCode in the simplified Huffman table 100 is 110, and the second base symbol index HfmBase[2].1stOfs in the simplified Huffman table 100 is 5. The difference Diff, which is equal to the second base Huffman code 110 minus the 3 most significant bits 011 in the bit stream, is equal to 3.

Then, step 1050 is repeated, whether the difference Diff is less than 0 is checked. As the difference Diff is equal to 3 but not less than 0, the method proceeds to step 1060, a symbol index Ofs is generated by deducting the difference Diff from the second base symbol index HfmBase[2].1stOfs. As the difference Diff is equal to 3 and the second base symbol index HfmBase[2].1stOfs is equal to 5, the symbol index Ofs is equal to 5−3=2. Next, the method proceeds to step 1070, a symbol S being equal to Sym[Ofs] is obtained from the symbol array Sym[ ] in the file header according to the symbol index Ofs. For example, let the symbol array be {0, 1, 2, 3, 4, 5, 6, 7, 8, 9, 10, 11}, and when the symbol index Ofs is equal to 2, the obtained symbol being equal to Sym[2] is equal to 2.

Then, the method proceeds to step 1072, the 3 most significant bits are removed from the bit stream 0111011 to obtain a new bit stream 1011.

To make the decoding method of the second embodiment easier to understand, the bit stream 0010 is exemplified below. Firstly, the method begins at step 1010, the number of leading 1's in the bit stream 0010 is equal to 0, and the lookup index m for the new lookup table 110 is obtained according to the number of leading 1's in the bit stream 0010, wherein the lookup index m equals 0.

Next, the method proceeds to step 1020, the base Huffman code index n in the simplified Huffman table 100 is equal to the base Huffman code index Lookup[0] recorded in the new lookup table 110, wherein Lookup[0]=1.

Then, the method proceeds to step 1030, 2 most significant bits 00 are obtained from the bit stream according to the base Huffman code index n which is equal to 1. Afterwards, the method proceeds to step 1040, the first base Huffman code HfmBase[1].1stCode in the simplified Huffman table 100 and the first base symbol index HfmBase[1].1stOfs are obtained for the first time according to the base Huffman code index n. The first base Huffman code HfmBase[1].1stCode in the simplified Huffman table 100 is 00, and the first base symbol index HfmBase[1].1stOfs in the simplified Huffman table 100 is 0. The difference Diff, which is equal to the first base Huffman code 00 minus 2 most significant bits 00 in the bit stream, is equal to 0.

After that, the method proceeds to step 1050, whether the difference Diff is less than 0 is checked. The difference Diff is equal to 0 but not less than 0.

Next, the method proceeds to step 1060, a symbol index Ofs is generated by deducting the difference Diff from the first base symbol index HfmBase[1].1stOfs. As the difference Diff is equal to 0 and the first base symbol index HfmBase[1].1stOfs is equal to 0, the symbol index Ofs is equal to 0−0=0. Next, the method proceeds to step 1070, a symbol S being equal to Sym[Ofs] is obtained from the symbol array Sym[ ] in the file header according to the symbol index Ofs. For example, let the symbol array be {0, 1, 2, 3, 4, 5, 6, 7, 8, 9, 10, 11}, and when the symbol index Ofs is equal to 0, the obtained symbol being equal to Sym[0] is equal to 0.

Then, the method proceeds to step 1072, the 2 most significant bits are removed from the bit stream 0010 to obtain a new bit stream 10.

The Huffman decoding method disclosed in the above embodiments of the invention has many features, and the larger the original Huffman table, the more significant the features will be.

Let the simplified Huffman table and the new lookup table thereof be smaller than the complete Huffman table and the conventional the look-up table. Referring to FIG. 13, a comparison of table size of JPEG Huffman table for AC luminance or AC chrominance according to conventional leading 1's search, conventional one-bit binary search and the present embodiment of the invention is shown. FIG. 13 is illustrated according to JPEG Huffman table for AC luminance or AC chrominance. According to the comparison indicated in FIG. 13, the table size of the simplified Huffman table of the present embodiment and the new lookup table thereof are smaller than that of the complete Huffman table and the conventional look-up table.

Referring to FIG. 14, a comparison of search iterations of JPEG Huffman table for AC luminance or AC chrominance according to conventional leading 1's search, conventional one-bit binary search and the present embodiment of the invention is shown. FIG. 14 is illustrated according to JPEG Huffman table for AC luminance or AC chrominance.

As the simplified Huffman table is smaller than the complete Huffman table, the reconstruction time for the simplified Huffman table and the new lookup table is shorter than that for the complete Huffman table and the conventional look-up table, hence increasing table reconstruction rate.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A decoding method, comprising:
   obtaining an $m^{th}$ lookup index for a new lookup table according to the number of leading 1's in a bit stream, wherein the $m^{th}$ lookup index is equal to the number of leading 1's in the to-be-decoded bit stream;
   obtaining an $n^{th}$ base Huffman code from a simplified Huffman table according to the $m^{th}$ lookup index, wherein the $n^{th}$ base Huffman code index indexes the $n^{th}$ base Huffman code in the simplified Huffman table and an $n^{th}$ base symbol index, and the base Huffman code index is equal to the bit length of the $n^{th}$ base Huffman code decreased by 1;

obtaining (n+1) most significant bits from the bit stream according to the $n^{th}$ base Huffman code index;

generating a difference according to the (n+1) most significant bits and the $n^{th}$ base Huffman code;

checking whether the difference is less than 0;

generating a symbol index according to the difference and the $n^{th}$ base symbol index if the difference is not less than 0;

obtaining a symbol according to the symbol index.

2. The decoding method according to claim 1, further comprising:

removing (n+1) most significant bits from the bit stream to generate a new bit stream.

3. The decoding method according to claim 1, wherein the difference is equal to the (n+1) most significant bits of the bit stream minus the $n^{th}$ base Huffman code.

4. The decoding method according to claim 1, wherein the difference is equal to the $n^{th}$ base Huffman code minus the (n+1) most significant bits of the bit stream.

5. The decoding method according to claim 1, further comprising:

adjusting the $n^{th}$ base Huffman code index if the difference is less than 0.

6. The decoding method according to claim 5, wherein in the step of adjusting the $n^{th}$ base Huffman code index, the $n^{th}$ base Huffman code index is progressively decreased.

7. The decoding method according to claim 5, wherein in the step of adjusting the $n^{th}$ base Huffman code index, the $n^{th}$ base Huffman code index is progressively increased.

8. The decoding method according to claim 1, wherein the symbol index is equal to the difference plus the $n^{th}$ base symbol index.

9. The decoding method according to claim 1, wherein the symbol index is equal to the $n^{th}$ base symbol index minus the difference.

10. The decoding method according to claim 1, wherein the step of obtaining (n+1) most significant bits from the bit stream according to the $n^{th}$ base Huffman code index comprises:

obtaining the bit length of the $n^{th}$ base Huffman code according to the $n^{th}$ base Huffman code index; and obtaining the (n+1) most significant bits from the bit stream according to the bit length.

11. The decoding method according to claim 1, wherein in the step of obtaining a symbol, the symbol is obtained according to the symbol index in a symbol array of a file header.

12. The decoding method according to claim 1, comprising:

creating the simplified Huffman table; and creating the corresponding new lookup table of the simplified Huffman table.

13. The decoding method according to claim 12, wherein in the step of creating the simplified Huffman table, the base symbol index and the base Huffman code for the simplified Huffman table are generated according to a symbol array, a number-of-Huffman-code array, that records the number of Huffman codes of each of possible bit-lengths and the index for the number-of-Huffman-code array, wherein the index value is equal to the bin-length minus 1.

14. The decoding method according to claim 13, wherein in the step of creating the simplified Huffman table, the $n^{th}$ base Huffman code in the simplified Huffman table is the smallest Huffman code among all (n+1)-bit codes in the original Huffman table.

15. The decoding method according to claim 13, wherein in the step of creating the simplified Huffman table, the $n^{th}$ base Huffman code in the simplified Huffman table is the largest Huffman code among all (n+1)-bit codes in the original Huffman table.

16. The decoding method according to claim 13, wherein in the step of creating the simplified Huffman table, the $n^{th}$ base symbol index is equal to the index for the symbol represented by the $n^{th}$ base Huffman code in the symbol array.

17. The decoding method according to claim 12, wherein in the step of creating the corresponding new lookup table of the simplified Huffman table, an $m^{th}$ base Huffman code for the new lookup table is generated according to the $n^{th}$ base Huffman code and the $n^{th}$ base Huffman code index in the simplified Huffman table.

18. The decoding method according to claim 12, wherein in the step of creating the corresponding new lookup table of the simplified Huffman table, the number of leading 1's of the $n^{th}$ base Huffman code in the simplified Huffman table is equal to m, and the $m^{th}$ base Huffman code index for the new lookup table is equal to the $n^{th}$ base Huffman code index in the simplified Huffman table.

19. The decoding method according to claim 12, wherein the simplified Huffman table comprises a plurality of base Huffman codes with m leading 1's respectively corresponding to a plurality of base Huffman code indexes, and the $m^{th}$ base Huffman code index for the new lookup table is the smallest among the base Huffman code indexes.

20. The decoding method according to claim 12, wherein the simplified Huffman table comprises a plurality of base Huffman codes with m leading 1's respectively corresponding to a plurality of base Huffman code indexes, and the $m^{th}$ base Huffman code index for the new lookup table is the largest among the base Huffman code indexes.

21. The decoding method according to claim 12, wherein when the $m^{th}$ lookup index for the new lookup table cannot be obtained from the simplified Huffman table, the Huffman code index corresponding to the $m^{th}$ lookup index for a new lookup table is equal to the Huffman code index corresponding to the $(m-1)^{th}$ lookup index for the new lookup table.

22. The decoding method according to claim 12, wherein when the $m^{th}$ lookup index for the new lookup table cannot be obtained from the simplified Huffman table, the Huffman code index corresponding to the $m^{th}$ lookup index for a new lookup table is equal to the Huffman code index corresponding to the $(m+1)^{th}$ lookup index for the new lookup table.

* * * * *